(12) United States Patent
Cox et al.

(10) Patent No.: US 10,114,300 B2
(45) Date of Patent: Oct. 30, 2018

(54) LITHOGRAPHIC APPARATUS AND DEVICE MANUFACTURING METHOD

(71) Applicant: ASML Netherlands B.V., Veldhoven, AH (NL)

(72) Inventors: Henrikus Herman Marie Cox, Eindhoven (NL); Mark Marcus Gerardus Heeren, Eersel (NL); Peter Michel Silvester Maria Heijmans, Weert (NL); Jacob Jan Velten, Eindhoven (NL); Johannes Hubertus Antonius Van De Rijdt, Gemert (NL); Godfried Katharina Hubertus Franciscus Geelen, Echt (NL); Abdelhamid Kechroud, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 62 days.

(21) Appl. No.: 14/419,640

(22) PCT Filed: Aug. 15, 2013

(86) PCT No.: PCT/EP2013/067054
§ 371 (c)(1),
(2) Date: Feb. 4, 2015

(87) PCT Pub. No.: WO2014/029678
PCT Pub. Date: Feb. 27, 2014

(65) Prior Publication Data
US 2015/0212435 A1   Jul. 30, 2015

Related U.S. Application Data

(60) Provisional application No. 61/691,718, filed on Aug. 21, 2012.

(51) Int. Cl.
*G03F 9/00* (2006.01)
*G03F 7/20* (2006.01)
(Continued)

(52) U.S. Cl.
CPC ........ *G03F 9/7096* (2013.01); *G03F 7/70758* (2013.01); *H02K 1/06* (2013.01);
(Continued)

(58) Field of Classification Search
CPC ..... G03F 7/70758; G03F 9/7096; H02K 1/06; H02K 2001/18; H02K 2213/03;
(Continued)

(56) References Cited

U.S. PATENT DOCUMENTS 5,225,725 A   7/1993   Shiraki et al.
5,701,041 A   12/1997  Akutsu et al.
(Continued)

FOREIGN PATENT DOCUMENTS

CN   1364333 A   8/2002
CN   1485702 A   3/2004
(Continued)

OTHER PUBLICATIONS

Machine translation of Korenaga, JP H09-189785, Jul. 1997.*
(Continued)

*Primary Examiner* — Peter B Kim
(74) *Attorney, Agent, or Firm* — Pillsbury Winthrop Shaw Pittman LLP

(57) ABSTRACT

An electromagnetic actuator includes a coil assembly including a coil; a magnet assembly including a first and a second magnet unit, each magnet unit including a magnetic yoke and a plurality of permanent magnets mounted to the magnetic yoke, the first and second magnet unit forming a magnetic circuit for receiving the coil assembly and, upon energizing the coil, generating a force in a first direction; and
(Continued)

a holder for holding the magnet units, wherein a weight ratio of the magnet assembly over the coil assembly is smaller than the weight ratio of the magnet assembly over the coil assembly when the ratio of force over electrical power is maximized.

17 Claims, 13 Drawing Sheets

(51) Int. Cl.
  H02K 41/035 (2006.01)
  H02K 9/22 (2006.01)
  H02K 1/06 (2006.01)

(52) U.S. Cl.
  CPC .............. *H02K 9/22* (2013.01); *H02K 41/035* (2013.01); *H02K 41/0356* (2013.01); *G03F 2009/005* (2013.01); *H02K 2201/18* (2013.01); *H02K 2213/03* (2013.01); *H02K 2213/12* (2013.01)

(58) Field of Classification Search
  CPC .............. H02K 2213/12; H02K 41/035; H02K 41/0356; H02K 9/22
  USPC .......................................................... 355/72
  See application file for complete search history.

(56) References Cited

U.S. PATENT DOCUMENTS

| | | | |
|---|---|---|---|
| 6,252,234 B1* | 6/2001 | Hazelton | F16F 15/02 250/442.11 |
| 6,661,125 B2 | 12/2003 | Itoh et al. | |
| 6,713,903 B2 | 3/2004 | Widdowson et al. | |
| 6,906,789 B2 | 6/2005 | Carter et al. | |
| 7,167,234 B2 | 1/2007 | Cox et al. | |
| 7,257,902 B2 | 8/2007 | Gao et al. | |
| 7,973,442 B2 | 7/2011 | Takahashi | |
| 8,373,848 B2 | 2/2013 | Boon et al. | |
| 8,885,147 B2 | 11/2014 | Vervoordeldonk et al. | |
| 9,081,307 B2 | 7/2015 | Hol et al. | |
| 9,130,443 B2 | 9/2015 | Mankala et al. | |
| 2002/0140298 A1* | 10/2002 | Maruyama | G03F 7/70758 310/54 |
| 2003/0141769 A1* | 7/2003 | Kubo | G03F 7/70758 310/12.06 |
| 2003/0213135 A1 | 11/2003 | Kaneko et al. | |
| 2004/0239911 A1 | 12/2004 | Carter et al. | |
| 2005/0094118 A1 | 5/2005 | Dams | |
| 2005/0168086 A1 | 8/2005 | Tamaki | |
| 2005/0200830 A1 | 9/2005 | Carter et al. | |
| 2006/0049701 A1 | 3/2006 | Sato | |
| 2006/0082753 A1 | 4/2006 | Cox et al. | |
| 2007/0273860 A1* | 11/2007 | Tanaka | G03F 7/70716 355/72 |
| 2008/0012511 A1 | 1/2008 | Ono | |
| 2008/0067415 A1 | 3/2008 | Asano | |
| 2010/0085552 A1 | 4/2010 | Boon et al. | |
| 2010/0214548 A1 | 8/2010 | Vervoordeldonk et al. | |

FOREIGN PATENT DOCUMENTS

| | | |
|---|---|---|
| CN | 1747079 A | 3/2006 |
| CN | 1934411 A | 3/2007 |
| CN | 101917110 A | 12/2010 |
| CN | 102315749 A | 1/2012 |
| JP | 2-193557 | 7/1990 |
| JP | 3-104088 | 10/1991 |
| JP | 6-254734 | 9/1994 |
| JP | 7-111238 | 4/1995 |
| JP | H09-189785 | 7/1997 |
| JP | 2006-54289 | 2/2006 |
| JP | 2006-230127 | 8/2006 |
| JP | 2008-295165 | 12/2008 |
| JP | 2010-93254 | 4/2010 |
| WO | WO 2006/035835 | 4/2006 |

OTHER PUBLICATIONS

J.L.G. Janssen et al., "High-Performance Moving-Coil Actuators with Double-Sided PM arrays: A Design Comparison," 2010 International Conference on Electrical Machines and Systems (ICEMS), pp. 1657-1662 (Oct. 10, 2010).

English translation of Japanese Office Action dated Feb. 22, 2016 in corresponding Japanese Patent Application No. 2015-527860.

International Search Report dated Oct. 11, 2013 in corresponding International Patent Application No. PCT/EP2013/067054.

* cited by examiner

LITHOGRAPHIC APPARATUS AND DEVICE MANUFACTURING METHOD

CROSS-REFERENCE TO RELATED APPLICATIONS

This application is the U.S. national phase entry of International Patent Application No. PCT/EP2013/067054, filed Aug. 15, 2013, which claims the benefit of priority from U.S. provisional application 61/691,718, which was filed on Aug. 21, 2012, and which is incorporated herein in its entirety by reference.

FIELD

The present invention relates to an electromagnetic actuator, a support for a lithographic apparatus, a manufacturing method for a support for a lithographic apparatus, and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to accurately position the substrate and patterning device, positioning devices including electromagnetic actuators and linear motors are typically applied. As an example, such positioning device can comprise a planar motor or a linear motor assembly (such as an H-drive arrangement) for displacing the substrate (e.g. mounted to a support) over comparatively large distances and an actuator assembly comprising a plurality of electromagnetic actuators such as Lorentz actuators, for accurately positioning the substrate and support over comparatively small distances. Typically, such motors and/or actuators are optimized with respect to the generated force per unit electrical power. However, when demands with respect to acceleration are increasing, actuators thus optimized may itself become the limiting factor. Therefore, there is a need to review and redesign known actuators and supports for substrates or patterning devices, in order to address increasing demands with respect to acceleration, or in general, stage performance.

SUMMARY

It is desirable to provide an electromagnetic actuator able to meet increased acceleration demands for supports in a lithographic apparatus.

According to an embodiment of the invention, there is provided an electromagnetic actuator comprising:
  a coil assembly comprising at least one coil;
  a magnet assembly comprising a first and second magnet unit, each magnet unit comprising a magnetic yoke and a plurality of permanent magnets mounted to the magnetic yoke, the first and second magnet unit forming a magnetic circuit for receiving the coil assembly and, upon energizing of said coil, generating a force in a first direction; and
  a holder for holding the magnet units; wherein a weight ratio of the magnet assembly over the coil assembly is smaller than the weight ratio of the magnet assembly over the coil assembly when the ratio of force over electrical power is maximized.

According to another embodiment of the invention, there is provided a support for supporting an object or object holder in a lithographic apparatus, the support comprises one or more actuators comprising:
  a coil assembly comprising at least one coil;
  a magnet assembly comprising a first and second magnet unit, each magnet unit comprising a magnetic yoke and a plurality of permanent magnets mounted to the magnetic yoke, the first and second magnet unit forming a magnetic circuit for receiving the coil assembly and, upon energizing of said coil, generating a force in a first direction; and
  a holder for holding the magnet units; wherein the holder of the one or more actuators is rigidly mounted to the support.

According to another embodiment of the present invention, there is provided a support for supporting an object or object holder in a lithographic apparatus, the support comprises a pair of actuators, each actuator comprising:
  a coil assembly comprising at least one coil;
  a magnet assembly comprising a first and second magnet unit, each magnet unit comprising a magnetic yoke and a plurality of permanent magnets mounted to the magnetic yoke, the first and second magnet unit forming a magnetic circuit for receiving the coil assembly and, upon energizing of said coil, generating a force in a first direction; and
  a holder for holding the magnet units; whereby a magnetic field distribution of the magnet assembly of a first actuator of the pair of actuators is a mirror image of a magnetic field distribution of a second actuator of the pair of actuators.

According to another aspect of the invention, there is provided a method of assembling a support for supporting an object or object holder in a lithographic apparatus, the method comprises:
  mounting a first and second magnet unit of an electromagnetic actuator according to the invention;
  subsequently mounting the holder to the support.

According to another aspect of the invention, there is provided a lithographic apparatus comprising:
an illumination system configured to condition a radiation beam;
a first support constructed to support a patterning device, the patterning device being capable of imparting the radiation beam with a pattern in its cross-section to form a patterned radiation beam;
a second support constructed to hold a substrate; and
a projection system configured to project the patterned radiation beam onto a target portion of the substrate,
wherein the first or second support comprises a support according to an embodiment of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
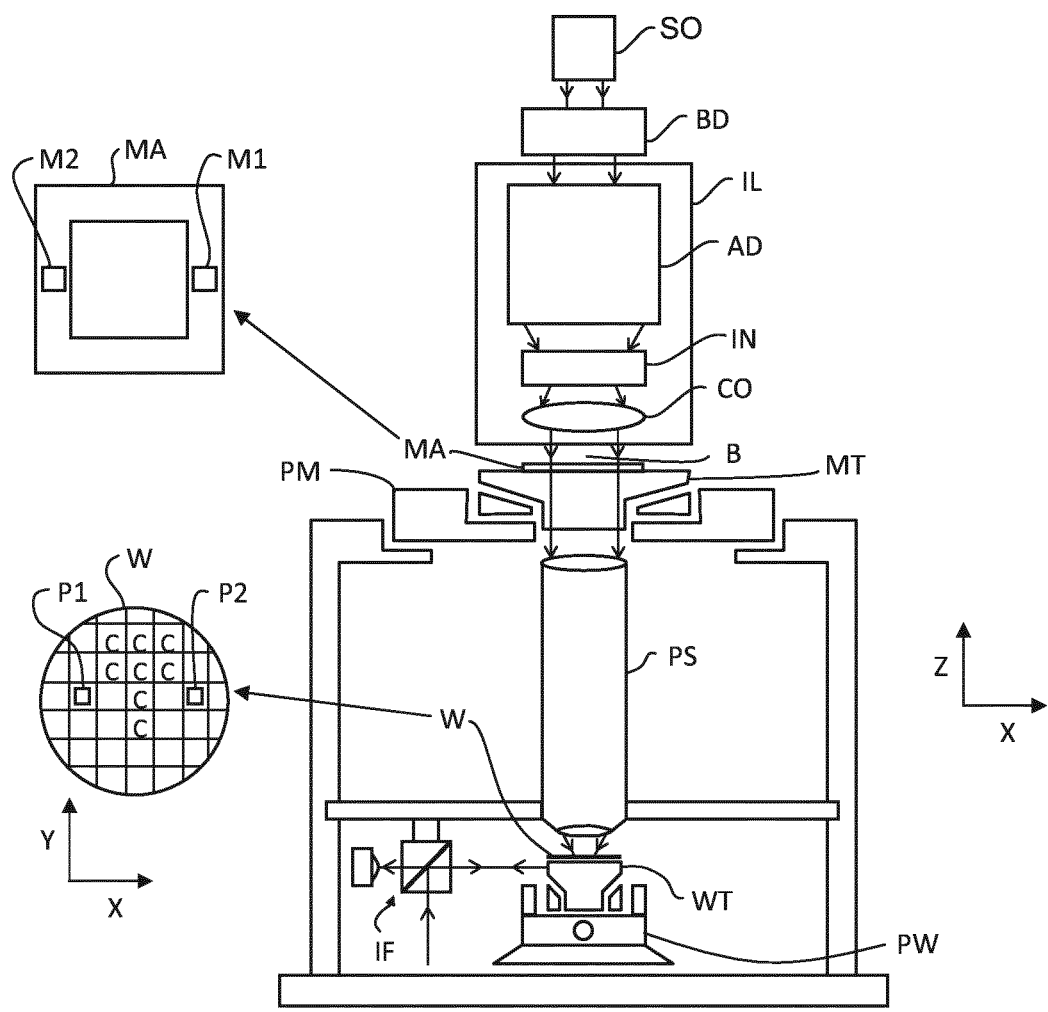
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

In accordance with an embodiment of the present invention, the first or second positioning device PM, PW may comprise one or more electromagnetic actuators having a coil assembly and a magnet assembly. In accordance with an embodiment of the present invention, a weight ratio of the magnet assembly over the coil assembly is smaller than the weight ratio of the magnet assembly over the coil assembly when the ratio of force over electrical power is maximized. In accordance with an embodiment of the present invention, it is further assumed that, when such actuators are e.g. applied in a lithographic apparatus for positioning a support, the magnet assemblies of the actuators are mounted to the support, whereas the coil assemblies are mounted to a (stationary) frame or moving member such as a long stroke positioning device (e.g. an H-drive or a planar motor). Various measures can be taken to reduce the mentioned weight ratio, as will be explained in more detail below. Taking such measures enables to reduce the total mass to be accelerated, this mass including the support, the object supported (e.g. the substrate or patterning device) and the magnet assembly or assemblies of the actuators applied. As will be illustrated below, when multiple actuators need to be applied (e.g. to generate forces in different directions), the weight of the magnet assemblies of these actuators (such magnet assemblies being connected or mounted to the support) can become a limiting factor in the attainable acceleration level. As such, redesigning known actuators having a maximized force over electrical power ratio can provide in actuators enabling higher acceleration levels, due to the reduction of the mass to be accelerated, i.e. the magnet assembly of the actuators.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
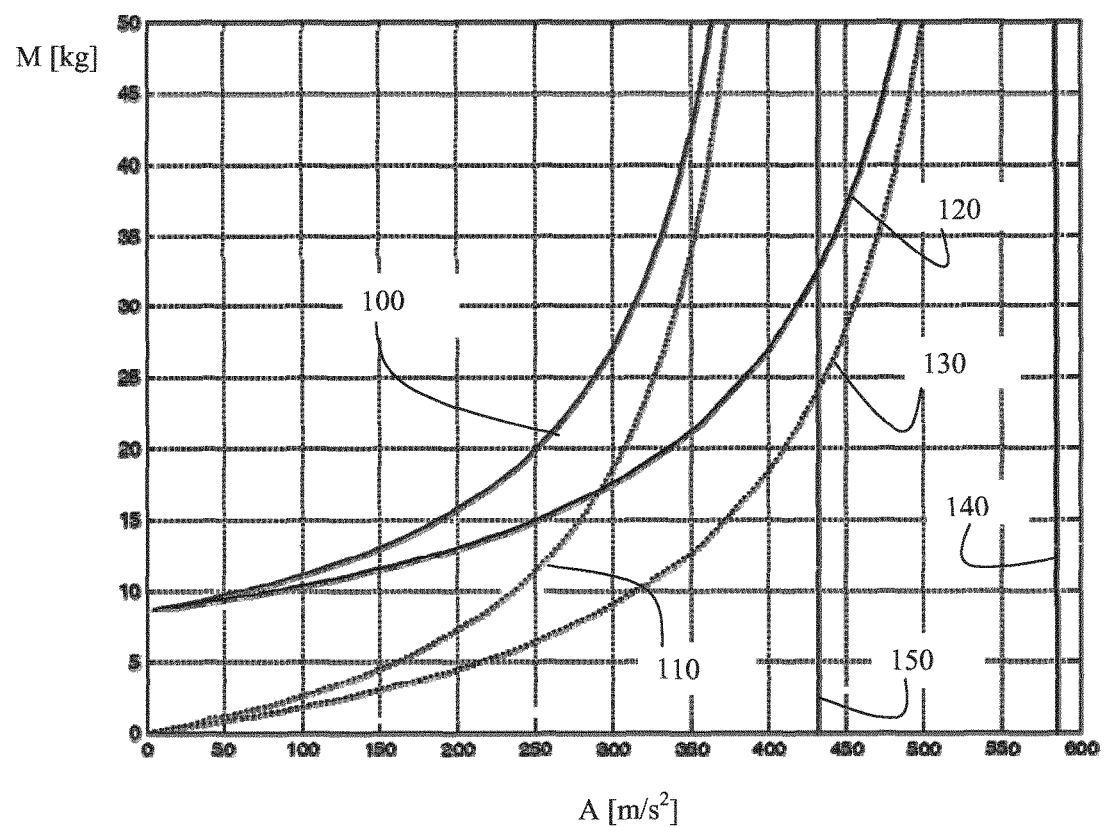
FIGS. 2 and 3 depict acceleration vs. mass graphs comparing a conventional actuator and an actuator according to an embodiment of the invention.

In FIG. 2, the total mass to be accelerated and the motor mass to be accelerated are shown as a function of acceleration for two types of motors:

a typical electromagnetic actuator that is optimized with respect to generated force per unit electrical power and an electromagnetic actuator according to the present invention.

In FIG. 2, graph 120 indicates, for a given payload mass (the payload mass indicating the mass to be accelerated excluding the applied motors or actuators) of 8.5 kg, the total mass to be accelerated M as a function of acceleration A using a typical actuator according to an embodiment of the invention. Graph 130 shows the corresponding mass of the actuator (or motor) to be accelerated. Similarly, graphs 100 and 110 show the total mass and corresponding motor mass to be accelerated for a known actuator. As can be seen, optimizing the actuator in accordance with an embodiment of the invention, results in a reduced required motor mass to be accelerated and enables higher acceleration levels to be obtained. Note that graphs 140 and 150 indicate, for the typical actuator according to an embodiment of the invention and the known actuator respectively, the maximum acceleration achievable. In FIG. 2, a typical load situation for a patterning device is shown, with a support mass of 8.5 kg and requiring acceleration in only one direction (e.g. Y-direction or scanning direction).

For such a situation, the total mass to be accelerated can be found as:

$$(M_{pay}+M_{motor})*Acc=K_{motor}*M_{motor} => M_{motor}=M_{pay}*Acc/(K_{motor}-Acc))$$

$$M_{total}=M_{pay}+M_{motor}=M_{pay}*(1+Acc/(K_{motor}-Acc)) \quad (1)$$

wherein $M_{pay}$=mass payload [kg] to be accelerated
$M_{motor}$=motor mass [kg] to be accelerated
Acc=Acceleration setpoint [m/s2]
Kmotor=Motor Force per Kg motor [N/kg]

Figure 3:
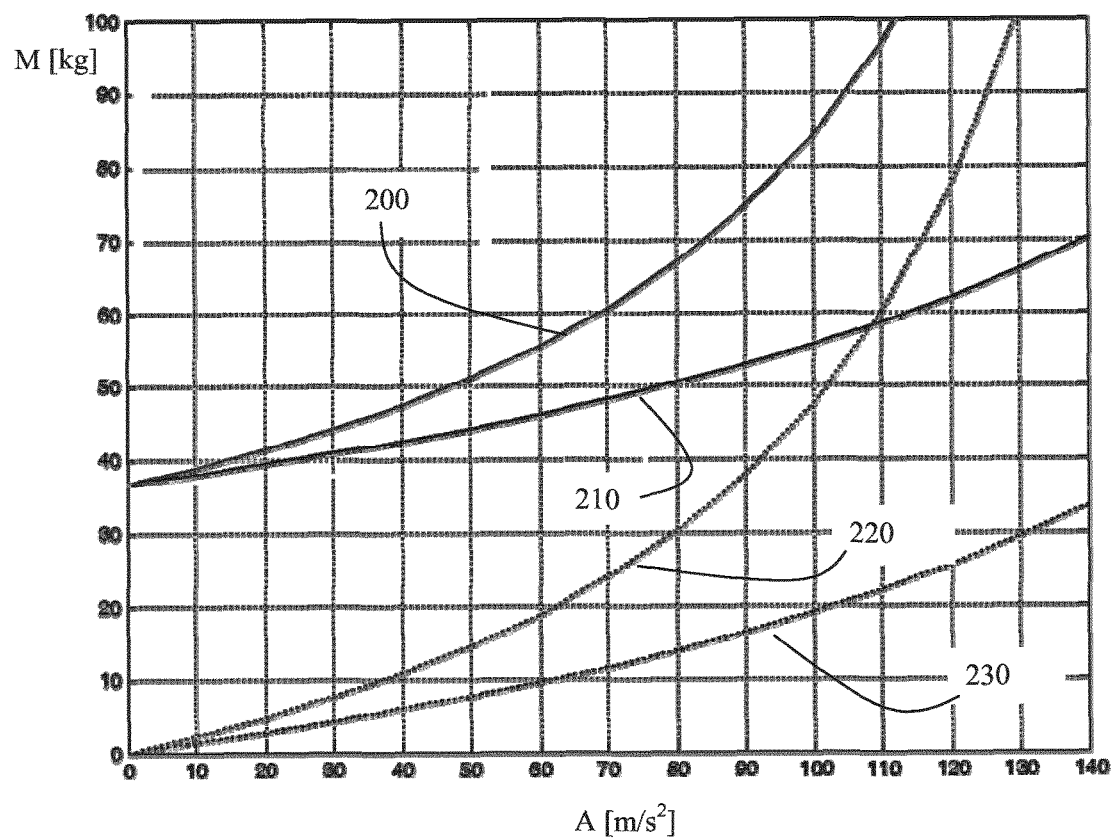

In FIG. 3, similar graphs are shown for a substrate support to be accelerated in two directions (x,y). Graph 220 indicates, for a given payload mass (the payload mass indicating the mass to be accelerated excluding the applied motors or actuators) of 36.5 kg, the total mass to be accelerated M as a function of acceleration A, using typical actuators according to an embodiment of the invention. Graph 230 shows the corresponding mass of the motor to be accelerated. Similarly, graphs 200 and 210 show the total mass and corresponding motor mass to be accelerated using a known actuator. Compared to the load situation of FIG. 2, a substrate support requires an acceleration in both the Y-direction (or scanning direction) and the X-direction, perpendicular to the scanning direction. Therefore, at least two actuators are required; the total mass to be accelerated can therefor be found as:

$$(M_{pay}+Mx_{motor}+My_{motor})*Acc=K_{motor}*Mx_{motor}$$

$$Mx_{motor}=My_{motor}=M_{motor} => Mx_{motors}=2*M_{pay}*Acc/(K_{motor}-3*Acc)$$

$$M_{total}=M_{pay}+M_{motors}=M_{pay}*(1+2*Acc/(K_{motor}-2*Acc)) \quad (2)$$

As can be seen from equation (2), the motor mass itself adds up by a factor of 2 in the total mass. FIGS. 2 and 3 thus illustrate the importance of the mass of the motor part that needs to be accelerated. In accordance with an embodiment of the present invention, measures are proposed to minimize the weight of the magnet assembly of the actuator according to an embodiment of the invention such that, when such magnet assemblies are e.g. used in a support according to the invention, the mass to be accelerated is reduced, compared to a conventional support.

Figure 4:
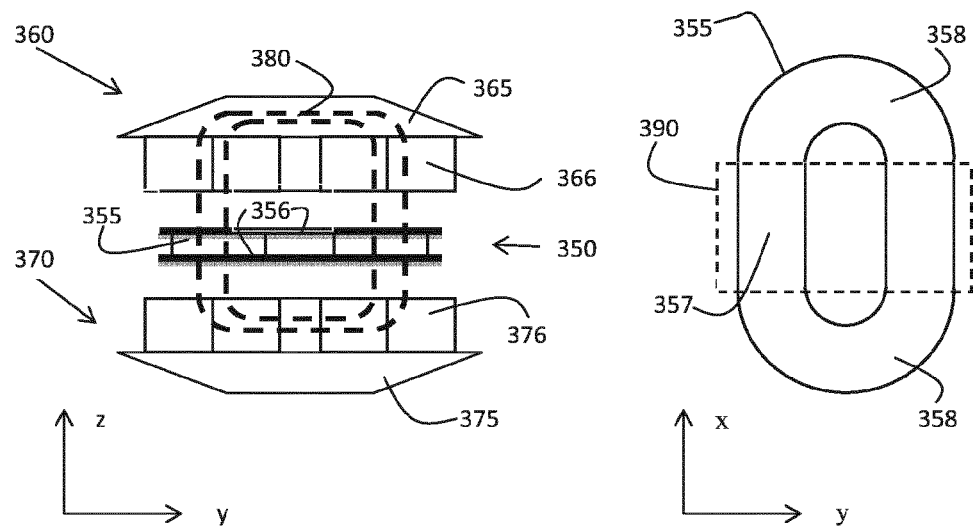
FIG. 4 schematically shows an actuator according to an embodiment of the present invention.
Figure 5:
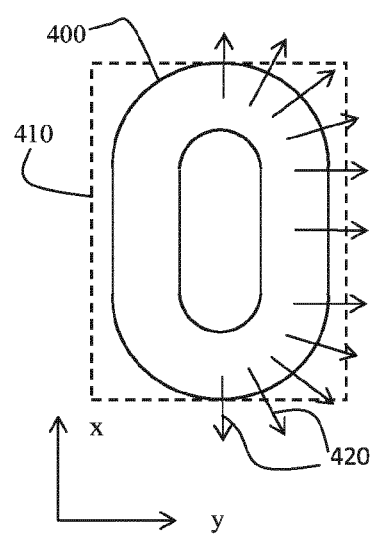
FIG. 5 schematically shows the generated force of a conventional actuator.

In FIG. 4, an electromagnetic actuator according to an embodiment of the present invention is schematically shown. On the left side, a YZ cross-sectional view of the actuator is shown comprising a magnet assembly and coil assembly. As shown, the magnet assembly comprises a first and second magnet unit 360, 370, each comprising a magnetic yoke 365, 375 and a plurality of permanent magnets 366, 376. The magnet units of the magnet assembly form a magnetic circuit 380 wherein the coil assembly 350 is disposed. The coil assembly comprises a coil 355 which, in the example shown, is stacked between two cooling members 356. On the right side of FIG. 4, an XY view of the coil 355 is schematically shown, together with a contour 390 representing a projection of an outer contour of the plurality of permanent magnets of one of the magnet units onto a plane of the coil 355. As can be seen, the coil 355 typically has a straight section 357 wherein the conductors forming the coil extend in the X-direction and curved sections 358. In accordance with an embodiment of the present invention, a projection of the magnet unit in a direction perpendicular to a plane co-planar with the coil (i.e. the XY-plane in FIG. 4) does not cover the curved sections 358 of the coil, but only covers the straight section 357 of the coil 355. Typically, the magnet units (or the permanent magnets thereof) of an electromagnetic actuator extend over a larger part of the coils, thus including (part of) the curved sections of the coil or coils. However, these parts are not effective in generating a resulting force in a desired direction (i.e. the Y-direction in FIG. 4). This is schematically indicated in FIG. 5, showing a coil 400 and a typical contour 410 of a magnet unit (or the permanent magnets thereof), which, as can be seen, covers both the curved sections and the straight section of the coil. Arrows 420 indicate the forces generated on the right side of the coil when the coil is energized. Note that, as can be seen, there is no net resulting force in the X-direction, since these force components will cancel out. The force components in the Y-direction, i.e. the components that contribute to the resulting force in the Y-direction, are found to be smaller in the curved sections. As, such, extending the magnet unit beyond the straight part of the coils of the coil assembly may require a disproportional increase in the weight of the magnet assembly, compared to the force that is gained.

In accordance with an embodiment of the present invention, the magnet units of the magnet assembly are held by a holder, not shown in FIG. 4. In an embodiment of the present invention, the holder comprises a C-shaped member for holding the magnet units.

Figure 6A:
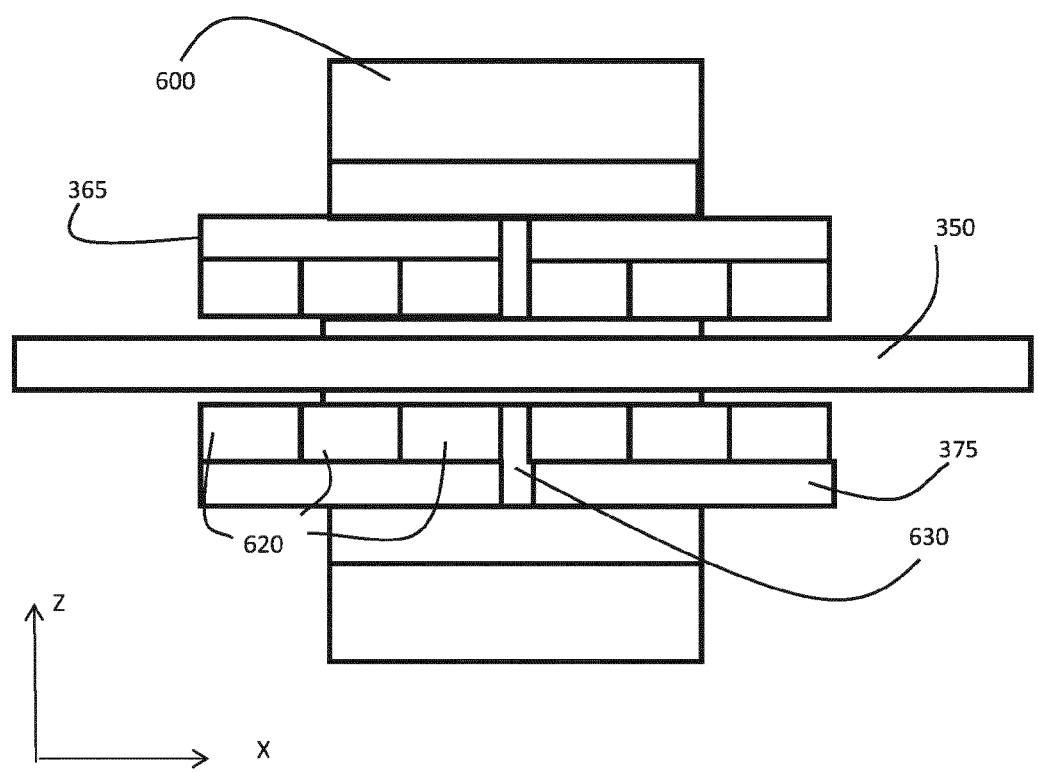
FIGS. 6a and 6b schematically shows an actuator according to an embodiment of the present invention including a holder of the actuator.
Figure 6B:
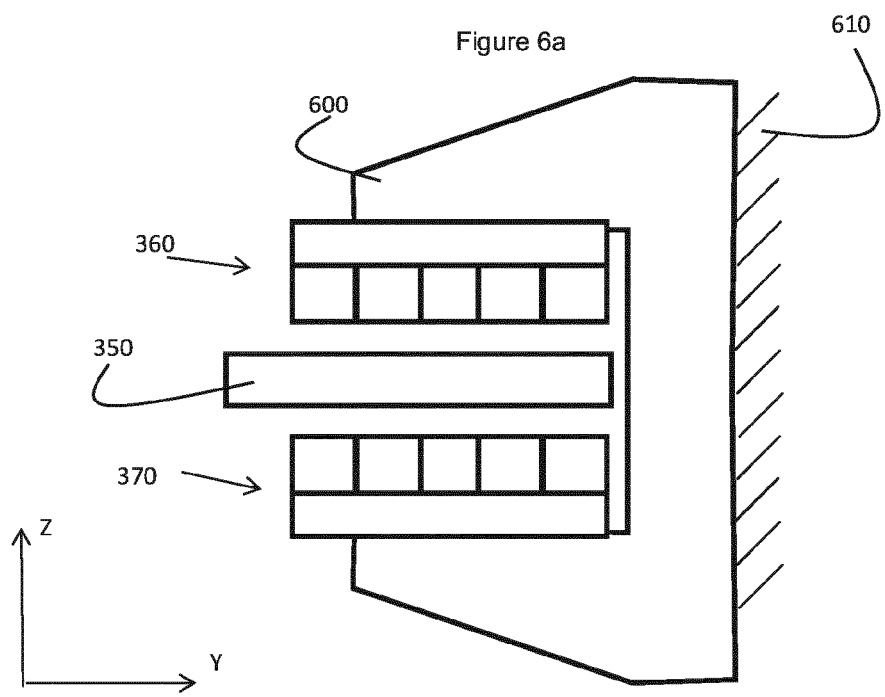

In an embodiment, the holder is adapted to be mounted substantially rigid to a support or object holder. Typically, an actuator is mounted to a support using leaf or plate springs or the like. By direct mounting (or substantially rigid mounting) of the actuator to the support (more particular of the holder holding the magnet units to the support), a further mass reduction of the mass to be accelerated may be realized. Furthermore, such direct mounting, which can e.g. be realized by gluing or bolting the holder to the support, may provide in an improved dynamic behavior as it enables to realize comparatively high eigen frequencies. This can result in a high servo bandwidth enabling an accurate positioning of the support. In FIGS. 6a and 6b, an actuator according to an embodiment of the invention is schematically shown including the holder 600. In the embodiment shown, the holder 600 has a C-shaped member and is rigidly mounted to the support 610, e.g. by gluing. In the embodiment shown, both magnet units 360 and 370 can be seen, the magnet units being mounted to the holder. In an embodiment, the magnet units may also be mounted in a substantially rigid manner to the holder, e.g. by gluing, bolting or any type of bonding. FIGS. 6a and 6b also show the coil assembly 350, which, as can be seen in FIG. 6a is substantially longer (in the X-direction) than the magnet assemblies, indicating that the magnet units do not overlap with the curved portions of the coil or coils of the magnet assembly.

Due to the substantially rigid mounting of the actuator to the support, via the holder 600, the thermal contact between the magnet assembly of the actuator and the support, e.g. supporting a substrate or patterning device, is increased. As a result, care should be taken to ensure that the heat load on the support remains within acceptable boundaries. In accordance with an embodiment of the present invention, several measures are proposed to mitigate any adverse effects of the heat load of the actuator, in particular the magnet assembly of the actuator, on the support. Such adverse effects of the heat load of the actuator can include a deformation of the support or an undesired heat load on the supported object, e.g. causing an unwanted thermal expansion.

In order to mitigate such effects, the holder, in an embodiment, is made from a material having a low coefficient of thermal expansion, such as Zerodur or Cordierite. Due to the low thermal expansion, the holder will hardly introduce any deformations into the support 610.

With respect to possible deformations of the support, an embodiment of the present invention further provides in a particular mounting order. In order to avoid or mitigate deformations of the support, caused by magnetic attractive forces between the magnet units, it is proposed to mount both magnet units of the actuator to the holder, prior to mounting the holder to the support. In this respect, it can be noted that an attractive force of several ~100 N can occur between the magnet units, which can cause the holder to deform. Since this is a static and constant (in time) deformation, a subsequent mounting of the holder to the support need not cause a deformation of the support. Such a deformation of the support should be avoided for the following reason: Typically, such a support is provided with a flat support surface for supporting an object, such as a substrate, whereby high demands with respect to the flatness of the surface have to be met. The mounting of the magnet units to the holder when the holder is already mounted to the support, would cause a deformation of the support surface.

As mentioned above, due to the rigid, direct mounting of the holder of the actuator to the support, care should be taken that adverse effects of the heat load of the actuator are kept to a minimum.

In accordance with an embodiment of the present invention, several measures are proposed to reduce the head load of the actuator.

In order to reduce the occurrence of Eddy currents in the permanent magnets or the magnet yoke, it is proposed to provide one or more slits in the permanent magnets or subdividing the permanent magnets into smaller sections. This can e.g. be seen in FIGS. 6a and 6b, whereby the permanent magnets of the magnet units comprise several smaller magnets 620. In a similar manner, slits can be provided in the magnet yokes 365 and 375. In a particular embodiment, the magnet units comprise two or more separate sections which are mounted independently to the holder. This can be seen in FIG. 6a wherein each magnet unit (comprising the magnet yokes 365, 375 and the permanent magnets 620) comprises two units, separated by a slit 630. By doing so, thermal stresses introduced in the holder 600 (which could cause a deformation of the support) can be further mitigated. Eddy currents may further be reduced by applying laminated iron in the magnet yokes. By taking these measures, an important reduction in the occurring Eddy currents in the magnet units can be realized.

Figure 7:
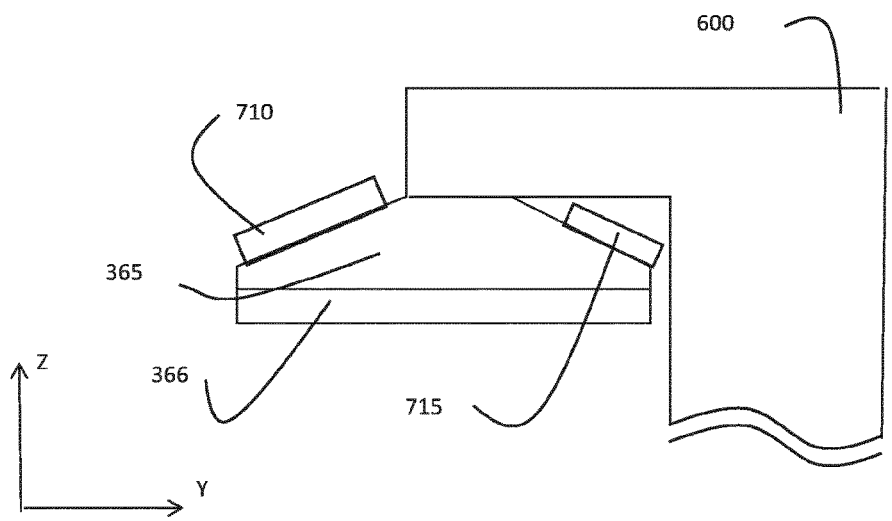
FIG. 7 schematically shows part of an actuator according to an embodiment of the invention, including a cooling member mounted to the magnetic yoke.

In order to further reduce the heat load of the actuator on the support, cooling members can be provided on the magnet units. Such arrangement is schematically shown in FIG. 7. FIG. 7 shows an YZ-view (comparable to the YZ view in FIG. 6b) of part of an electromagnetic actuator according to an embodiment of the present invention, the actuator comprising two magnet units of which only the upper magnet unit (comprising a magnet yoke 365 and a permanent magnet array 366) is visible. The magnet units are mounted to a holder 600. The actuator further comprises a cooling member 710 mounted to an outer surface of the magnetic yoke 365 of the magnet unit. The cooling member can e.g. extend along the entire length of the magnet yoke in the Y-direction, perpendicular to the XZ-plane. The cooling member 710 can e.g. be provided with an inlet and an outlet to provide a cooling fluid, such as water, to the cooling member 710. Optionally, a second cooling member 715 can be mounted to the outer surface of the magnet yoke 365. Both cooling members can have a common or separate cooling liquid supply.

Figure 8:
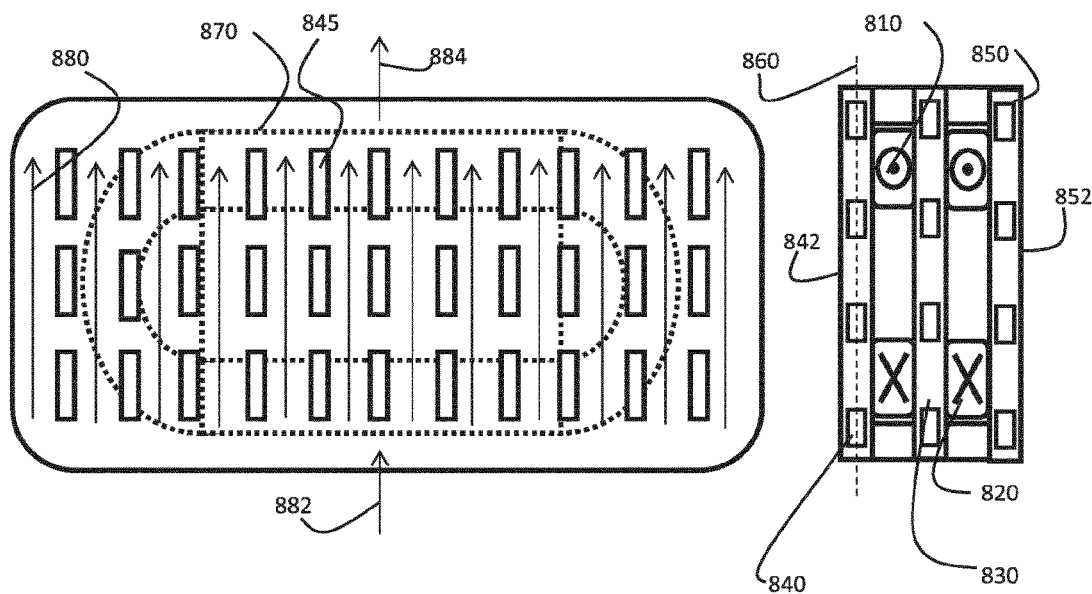
FIG. 8 schematically shows a coil assembly and cooling member of an actuator according to an embodiment of the invention.

In accordance with an embodiment of the present invention, an improved cooling of the coil assembly is further proposed. In an embodiment, the coil assembly comprises a first coil and a second coil, the coil assembly further comprises an inner cooling member arranged between the first and second coil and a first and second outer cooling member, the first and second coil and inner cooling member being stacked between the first and second outer cooling member. In FIG. 8, a cross-sectional view of such an arrangement is schematically shown, together with a cross-sectional view of a cooling member which can be applied as an inner or outer cooling member of the arrangement. On the right of FIG. 8 a coil assembly comprising a first coil 810 and a second coil 820 is schematically shown. An inner cooling member 830 is stacked between the first and second coil and a first and second outer cooling member 840 and 850 enclose the coils 810 and 820. On the left of FIG. 8, a cross-sectional view of the cooling member 840 (taken along the line 860) is schematically shown. In the cross-sectional view, the arrows 880 indicate a possible direction of the flow of cooling liquid from a source 882 to a drain 884. The cooling member comprises a plurality of spacers 845 for separating two plates thus forming cooling channels for a cooling liquid. In an embodiment, in particular for the outer cooling members, the cross-sectional area of the spacers 845 is comparatively small. The outer surfaces 842 and 852 of the outer cooling members should substantially remain at the temperature of the cooling fluid, in order not to cause any heat load (e.g. by radiation). Therefore, any thermal short-circuits between the inner surface of the cooling member (which is close to the coil and thus at an elevated temperature) should be kept as small as possible.

In an embodiment, the inner and outer cooling members can have a common supply system for cooling liquid. In such arrangement, the cooling liquid is provided to the outer cooling members first after which the cooling liquid is provided to the inner cooling member 830.

The coils can e.g. comprise copper wound coils that are connected in series.

Figure 9:
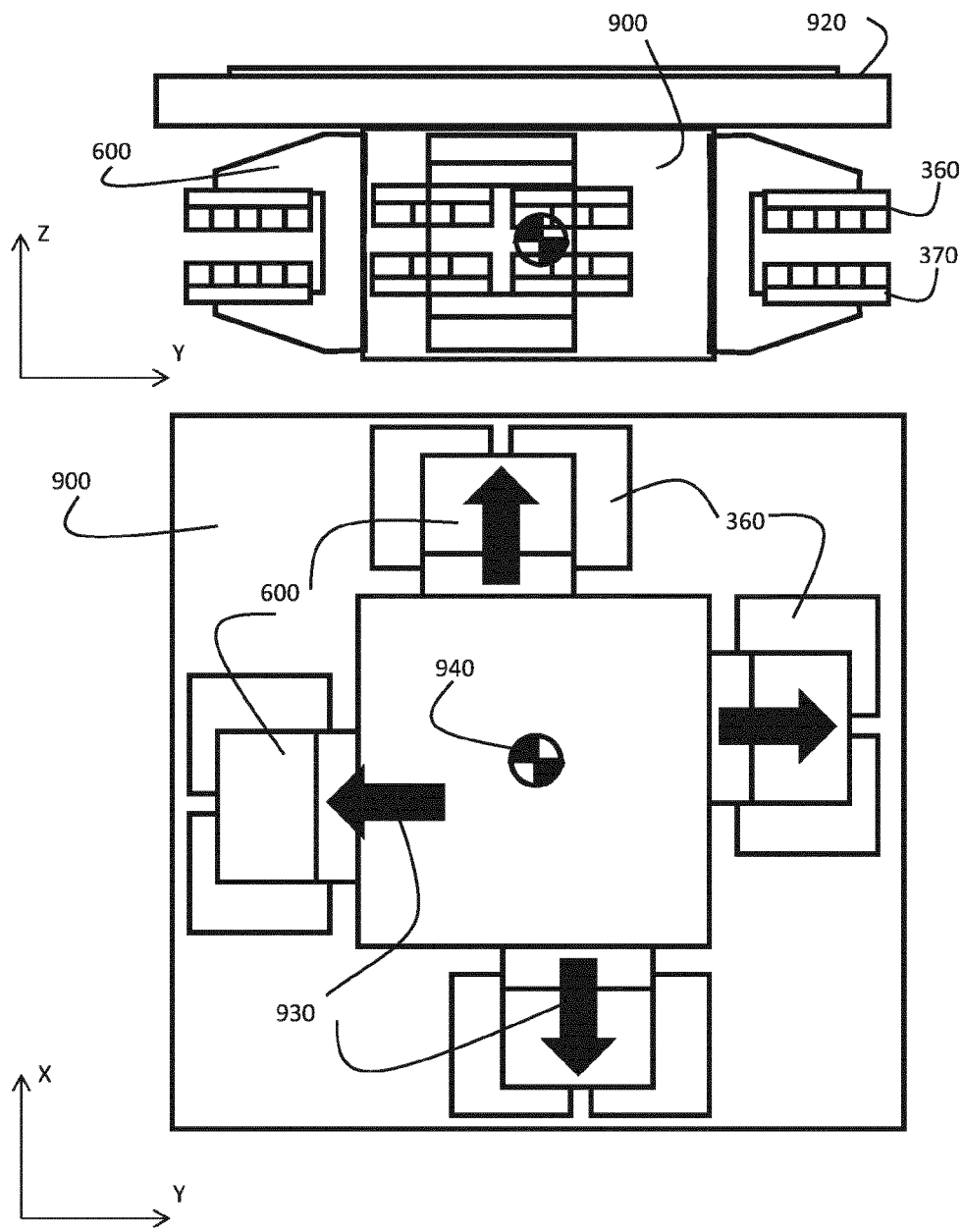
FIG. 9 schematically shows a support according to an embodiment of the invention.

In FIG. 9, a support 900 according to an embodiment of the present invention is schematically shown, together with 4 magnet assemblies 360, 370 and holders 600 of 4 electromagnetic actuators according to an embodiment of the invention. The 4 actuators enable an accurate positioning of the support in X- and Y-direction, the XY-plane being co-planar to the support surface 920 of the support, and rotation of the support about the Z-axis, perpendicular to the XY-plane. In FIG. 9, the direction of the forces which can be generated by the actuators are further indicated by the arrows 930. By ensuring that the force is not directed through the center of gravity of the support, a rotation about the Z-axis can be realized. As an alternative to the application of the 4 actuators as shown, each side, or two opposing sides, can be provided with at least two actuators instead of one, e.g. depending on the force requirements for accelerating the support.

As an alternative to the mounting of the magnet units on a C-shaped holder, the magnet units can be mounted to a holder having an aperture, whereas a side surface of the holder is subsequently mounted to the support.

Figure 10:
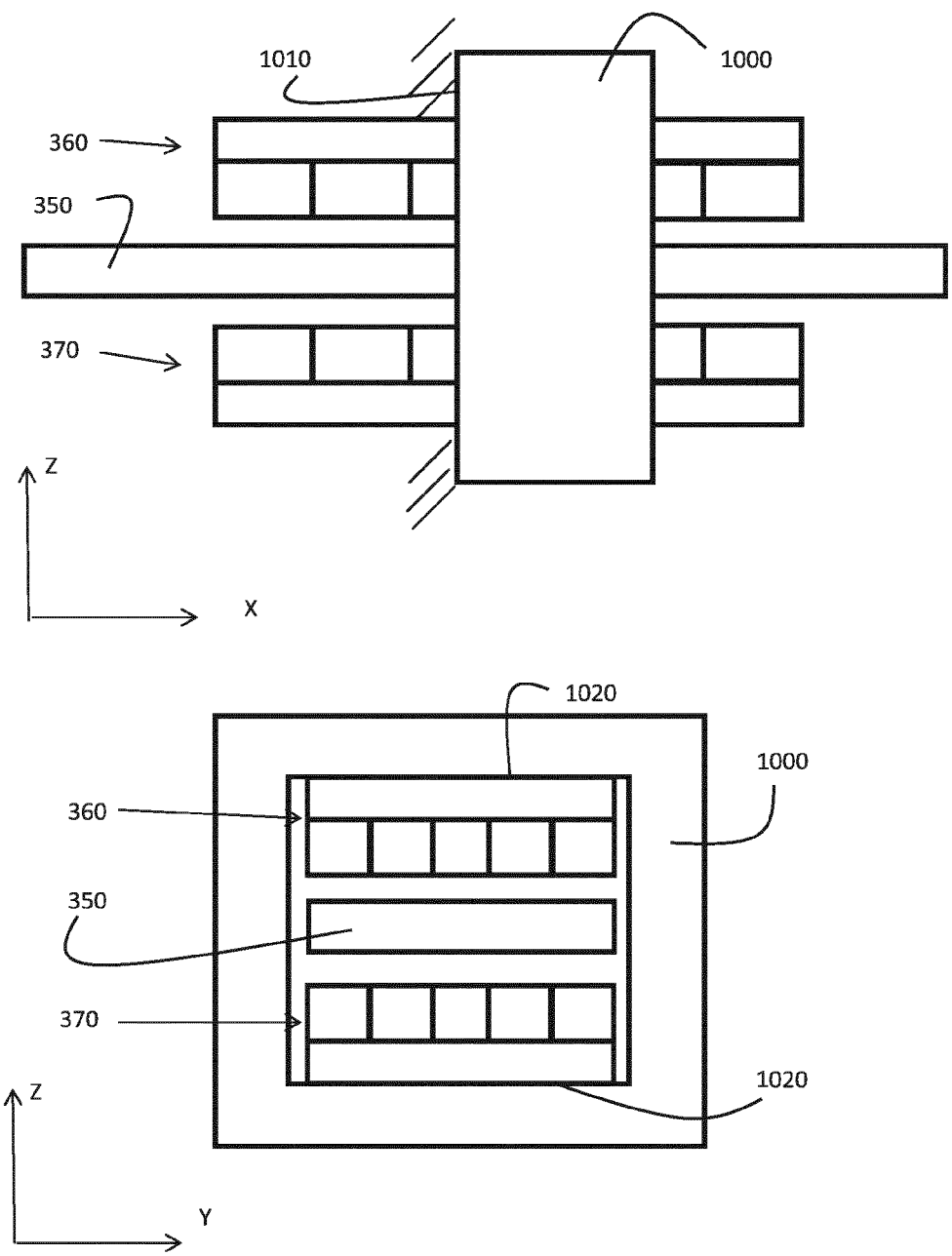
FIG. 10 schematically shows another actuator according to an embodiment of the invention.

In FIG. 10, such an actuator is schematically shown. At the top of FIG. 10, an XZ-view is shown of the magnet assemblies 360, 370 and the coil assembly 350 of the actuator. The magnet assemblies are mounted to a holder 1000 that can be mounted with a side surface 1010 to a support, see also FIG. 11. At the bottom part, an YZ-view is shown of the magnet assemblies 360, 370 and the coil assembly 350 of the actuator (Y being the direction in which a force can be generated by the actuator. As can be seen, the magnet assemblies 360, 370 are mounted to an inner surface 1020.

Figure 11:
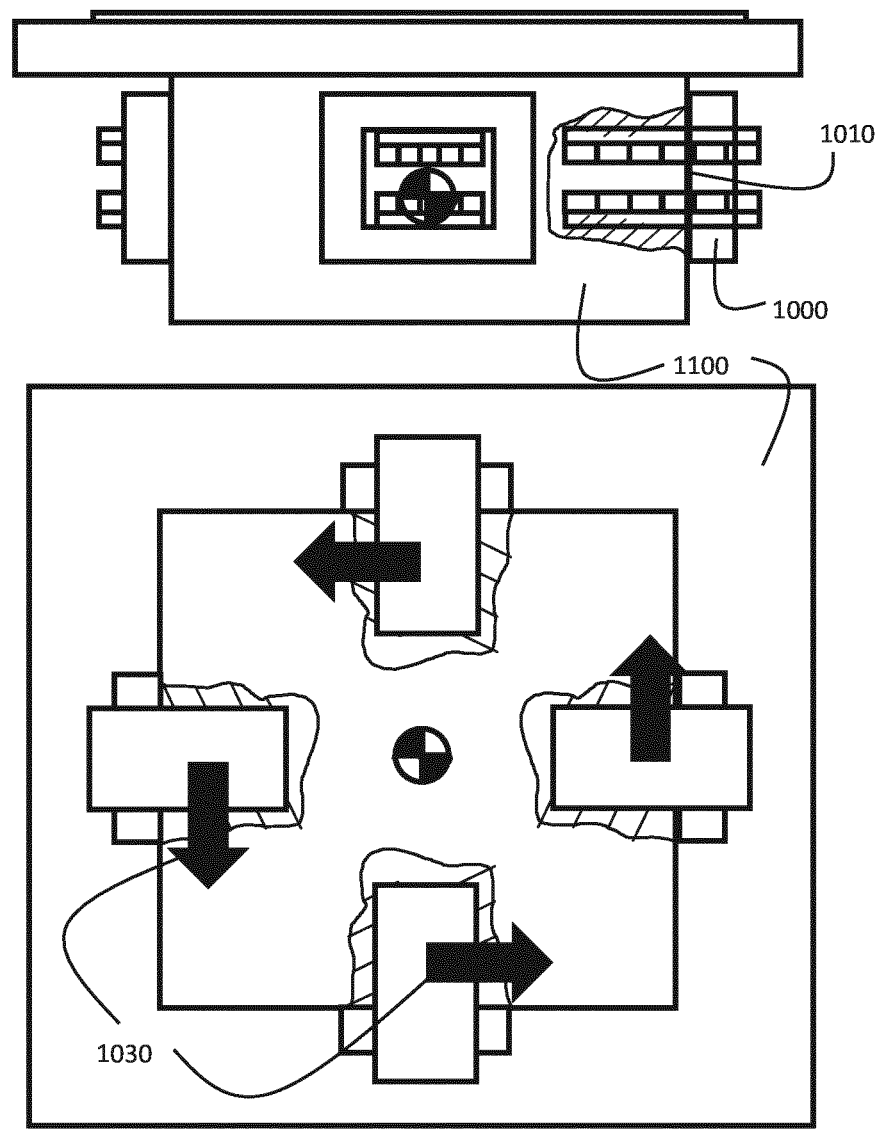
FIG. 11 schematically shows another support according to an embodiment of the invention.

FIG. 11 schematically shows a support to which 4 actuators as shown in FIG. 10 are mounted.

At the top, a front view is shown of the support 1100 and a cut away showing the mounting of the actuator holder 1000 via a side surface 1010 to the support 1100. At the bottom of FIG. 11, a top view is shown of the actuators and the support, including (indicated by the arrows 1030) the direction of the forces that can be generated.

Figure 12:
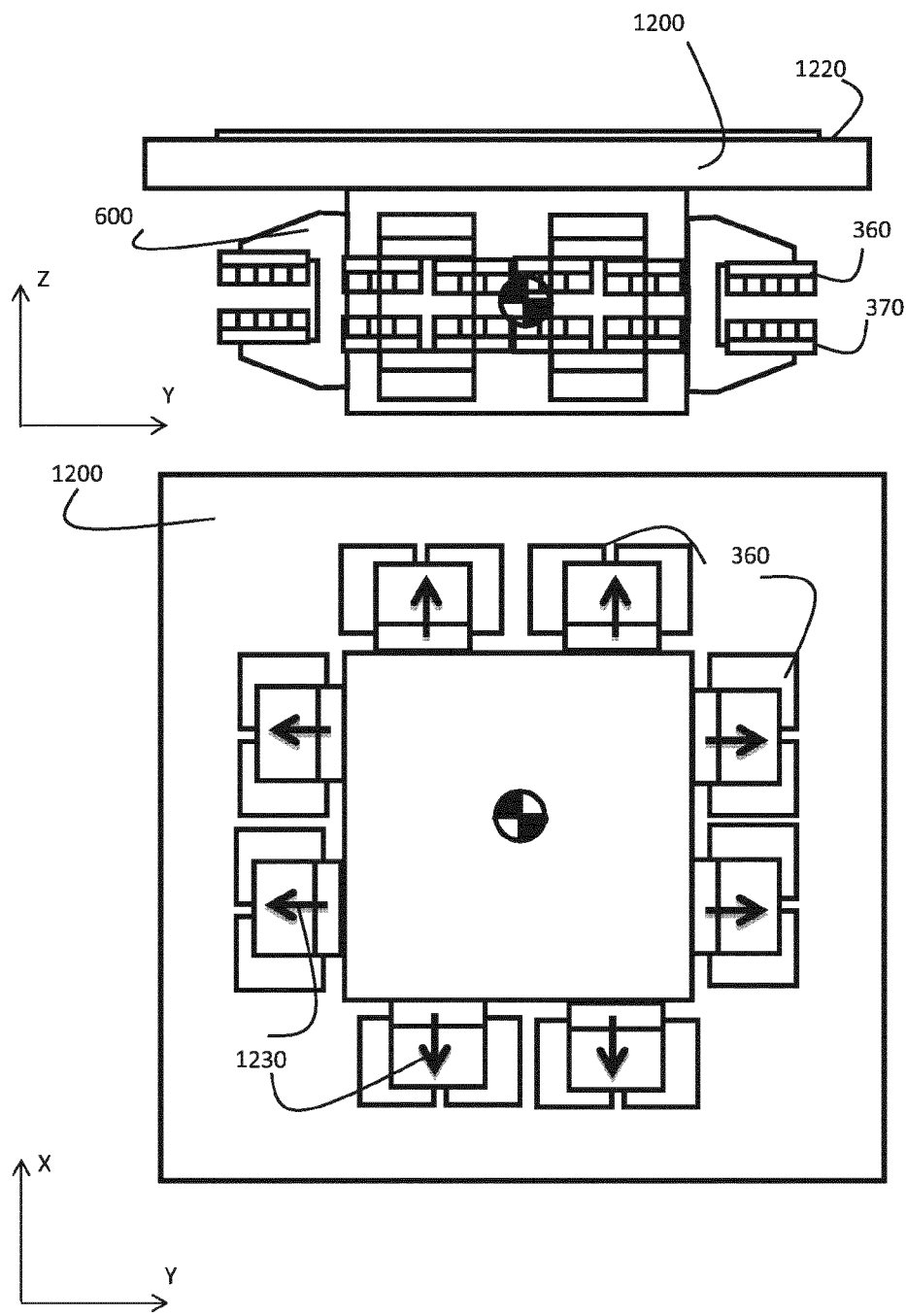
FIG. 12 schematically shows a support including 8 actuators according to an embodiment of the invention.

In FIG. 12, a support 1200 according to an embodiment of the present invention is schematically shown, together with 8 magnet assemblies 360, 370 and holders 600 of 8 electromagnetic actuators according to an embodiment of the invention. The 8 actuators are arranged in pairs on the four sides of the support and enable an accurate positioning of the support in X- and Y-direction, the XY-plane being co-planar to the support surface 1220 of the support, and rotation of the support about the Z-axis, perpendicular to the XY-plane. In FIG. 12, the direction of the forces which can be generated by the actuators are further indicated by the arrows 1230. In an alternative embodiment pull-only reluctance actuators can be used in combination with a co-fired support 1200.

As mentioned, by substantially rigidly mounting of the actuators to the support, which can e.g. be realized by gluing or bolting the holder to the support, an improved dynamic behavior can be realized as it enables to realize comparatively high eigen frequencies. This can result in a high servo bandwidth enabling an accurate positioning of the support. Due to this rigidly mounting, additional measures with respect to a heat transfer may need to be taken, such measures e.g. including the use of slitted magnets or magnetic yokes, the use of cooling members on the magnet assemblies or coil assembly, the use of laminated iron or iron alloys.

Figure 13:
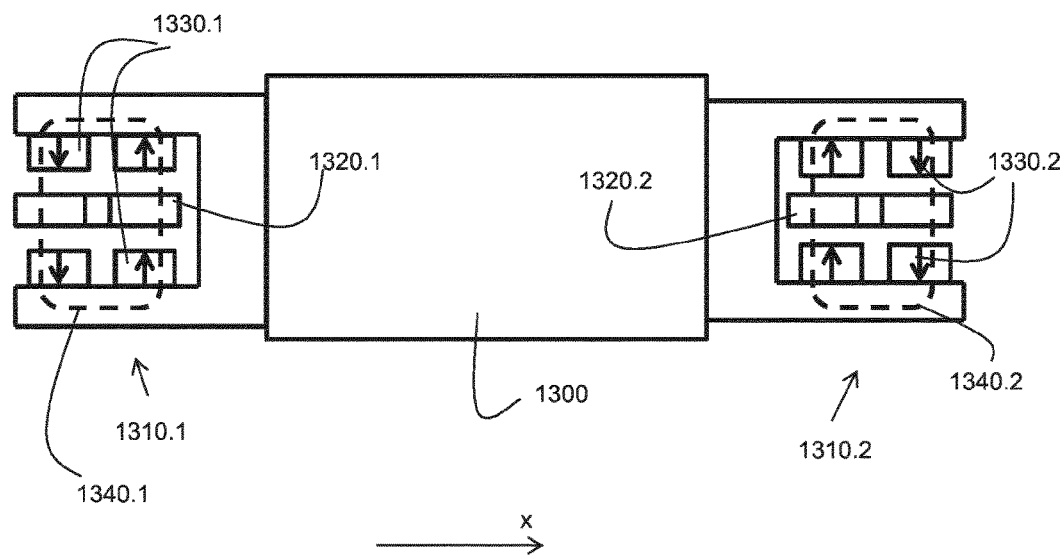
FIG. 13 schematically shows another support according to the present invention, including a pair of actuators.

In an embodiment, the support according to the invention comprises a pair of actuators such as the actuators as described above, whereby a magnetic field distribution of the magnet assembly of a first actuator of the pair of actuators is a mirror image of a magnetic field distribution of a second actuator of the pair of actuators. Such an arrangement is schematically illustrated in FIG. 13. FIG. 13 schematically shows a cross-sectional view of a support 1300 to which a pair of actuators 1310.1 and 1310.2 are mounted. Each actuator of the pair or actuators comprises a coil assembly 1320.1 and 1320.2 and a magnet assembly 1330.1 and 1330.2. In accordance with the embodiment of the present invention, the permanent magnets of the magnet assembly are arranged in such manner that the magnetic field distribution as generated by the magnet assembly of the first actuator 1310.1 is a mirror image of the magnetic field distribution as generated by the magnet assembly of the second actuator 1310.2. In accordance with the present invention, the mirror image is considered relative to a plane that is substantially perpendicular to the nominal force direction of the actuator, i.e. the x-direction as indicated. When e.g., considering a cross-section of the actuators and support as shown in FIG. 13, the magnets of the magnet assembly of the first actuator generate a magnetic flux 1340.1 in a counterclockwise direction whereas the magnets of the magnet assembly of the second actuator generate a magnetic flux 1340.2 in a clockwise direction, as can be seen from the orientation of the magnetic poles of the permanent magnet (as indicated by the arrows in the magnets) and the corresponding magnetic flux 1340.1 and 1340.2.

It has been devised by the inventors, that by such arrangement of a pair of actuators, certain parasitic effects can be cancelled. This can be understood as follows:

For optimal operation, with respect to controllability of the support, a magnetic field distribution should be homogeneous and directed perpendicular to the coil or coils of the coil assembly. When a current carrying coil would be applied in such a magnetic field, a force would be generated, that remains substantially constant irrespective of the relative position of the coil and the magnet assembly and that is substantially proportional to the current applied to the coil. In practice however, the magnetic field is at least to some extend a non uniform field. In addition the magnet field is not constant because the current through the coil or coil assembly also generates a magnet field that interacts with the magnetic field as generated by the magnet assembly. As a result of the non-uniformity of the magnetic field as generated by the magnet assembly and the interaction between the magnetic field as generated by the magnet assembly and the magnetic field generated by the current carrying coil, the following parasitic effects may occur:

For a given current, the force as generated by the actuator may depend on the position of the coil assembly relative to the magnet assembly.

The force as generated by the actuator may not be proportional to the applied current The parasitic effects can be modelled mathematically using the following formulas:

$$Fh = (A_0 + A_2{*}h + A_4{*}h^2 + A_6{*}v^2 + A_8{*}v^2){*}i + (A_1 + A_3{*}h + A_5{*}h^2 + A_7{*}v + A_9{*}v^2 + A_{11}{*}v{*}h){*}i^2$$

$$Fv = (B_0 + B_2{*}h + B_4{*}h^2 + B_6{*}v^2 + B_8{*}v^2){*}i + (B_1 + B_3{*}h + B_5{*}h^2 + B_7{*}v + B_9{*}v^2 + B_{11}{*}v{*}h){*}i^2 \qquad (3)$$

Whereby:
Fh=the generated force in the horizontal direction h;
Fv=the generated force in the vertical direction v;

h, v=the offset in the horizontal respectively the vertical position of the coil assembly relative to the magnet assembly;

i=the current as applied to the coil assembly;

Ai, Bi=coefficients representing the proportionality between the parameters h, v and i and the force components.

Figure 14:
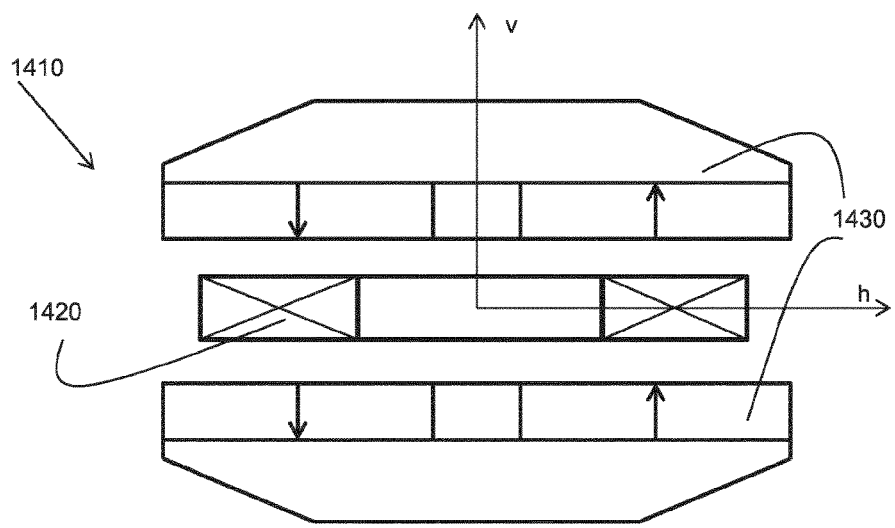
FIG. 14 schematically shows a cross-section of an electromagnetic actuator as known in the art.

In FIG. 14, an electromagnetic actuator 1410 is schematically shown together with the axis h and v representing the horizontal and vertical directions h and v.

The actuator 1410 as shown comprises a coil assembly 1420 and a magnet assembly 1430. When a current i is applied to the coil assembly, force components Fh and Fv as given by equation (1) may be generated, whereby h and v represent an offset of the coil assembly 1420 relative to a nominal (central) position as shown in FIG. 14. The actuator non-linearity is thus a function of the actuator current, and the relative position of the coil assembly 1420 and magnet assembly 1430, which can be described as a polynomial function with coefficients Ai and Bi as shown above.

From the above equation (3), it can be concluded that the resulting force (Fh, Fv) comprises parasitic effects that are partially linear with the actuator current i and partially quadratic with the current. Further, the horizontal h and vertical v coil assembly to magnet assembly offsets result in position dependent linear and quadratic disturbing force components. As such, the above equation (3) can be regrouped and represented as:

$$F(h,v)=Km_0*i+Km_1(h,h^2,v,v^2)*i+Km_2(h,h^2,v,v^2)*i^2 \quad (4)$$

whereby:

Km0=a constant;

$Km_1$=a first (parasitic) coefficient representing the parasitic force components that are proportional to the current i;

$Km_2$=a second (parasitic) coefficient representing the parasitic force components that are proportional to the current $i^2$.

Given the derived equations (3), (4), one can observe that, when a pair of actuators is applied to generate a resulting force, the orientation of the actuators affects the resulting parasitic forces. This can be understood as follows: Referring to FIG. 13 and applying equation (4), the force F1 of the first actuator 1310.1 can be represented by:

$$F1=Km_0*i+Km_1*i+Km_2*i^2 \quad (5)$$

Due to the different (mirrored) orientation of the magnet assembly of the second actuator 1310.2 of FIG. 13, the force F2 generated by the second actuator 1310.2 can be represented by:

$$F2=-Km_0*i-Km_1*i-Km_2*i^2 \quad (6)$$

As such, when the same nominal current i is applied in both actuators, opposing forces are generated. In case the actuators are arranged to co-operate to generate a resulting force Fr whereby each actuator provides in half the resulting force (this can e.g., be realized by applying a current −i in the second actuator), a resulting force Fr is obtained as:

$$Fr=F1+F2=Km_0*i+Km_0*(-i)+Km_1*i-Km_1*(-i)+Km_2*i^2-Km_2*(-i)^2$$

$$Fr=2Km_0*i+2Km_1*i \quad (7)$$

As can be seen, due to the mirrored orientation (i.e. the application of a magnetic field distribution in the first actuator that is a mirror image of the magnetic field distribution in the second actuator), the parasitic force components that are proportional to the current $i^2$ cancel each other.

Figure 15:
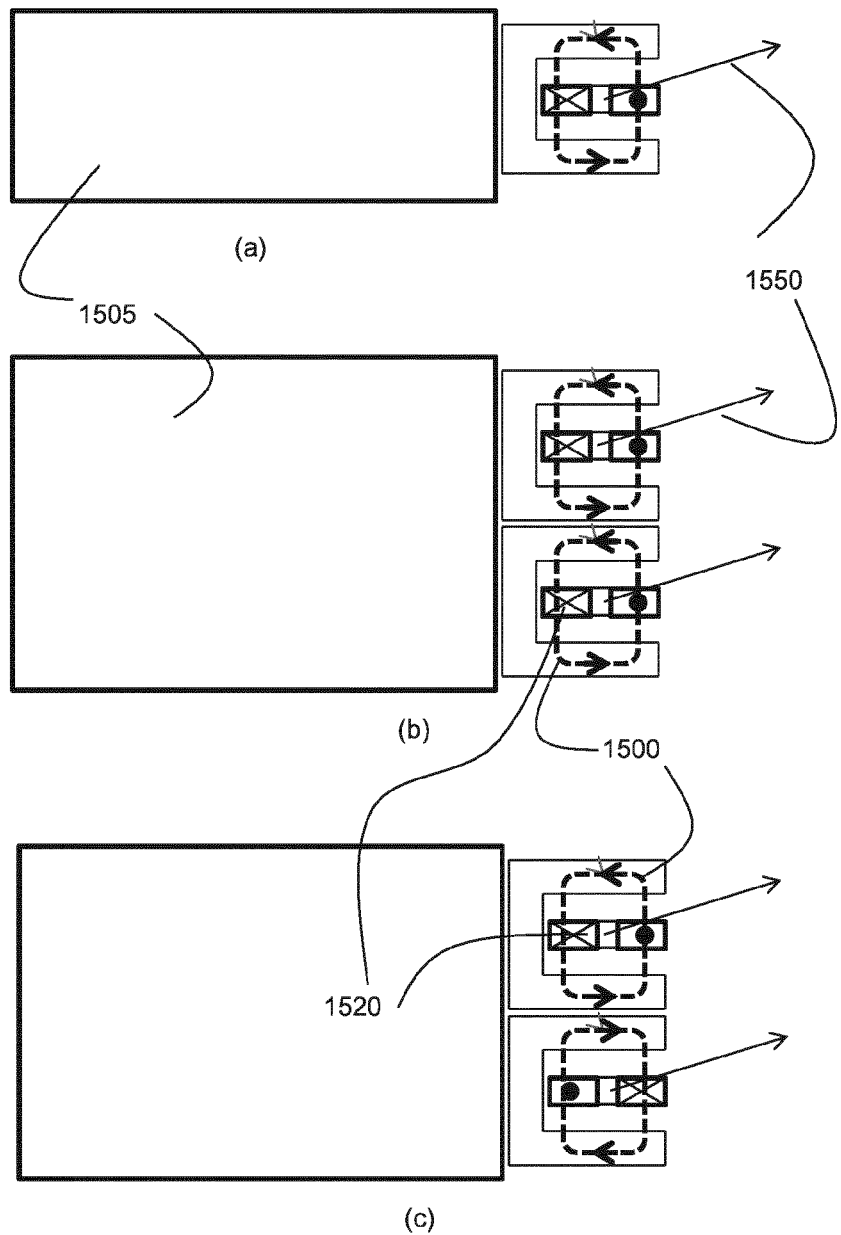
FIGS. 15 and 16 schematically show various mounting arrangements of electromagnetic actuators on a support.

FIG. 15 schematically shows different arrangements of pairs of actuators in order to illustrate the effect of cancelling the parasitic force components that are proportional to the current $i^2$. For clarity purposes, the magnets of the magnet assemblies are not shown, only the magnetic flux distributions (indicated by reference number 1500) and the coil assemblies 1520 of the actuators are shown, together with an arrow 1550 indicating the direction of the generated force.

In FIG. 15 (a), a single actuator is applied to exert a force on a support 1505. The actuator force would thus comprise the force components as described by equation (4).

In FIG. 15 (b), two actuators are applied having the same orientation for the magnetic flux distribution. As a result, the generated force would comprise the same force components as for the situation in FIG. 15 (a).

In FIG. 15 (c) however, the magnetic field distribution of the bottom actuator is the mirror image of the magnetic field distribution of the top actuator. By applying the appropriate orientation of the current in the bottom actuator, the generated force can be (as described above) in substantially the same direction as for the top actuator. Due to the different (mirrored) magnetic field distribution, the parasitic force components that are proportional to the current $i^2$ will however cancel each other.

Figure 16:
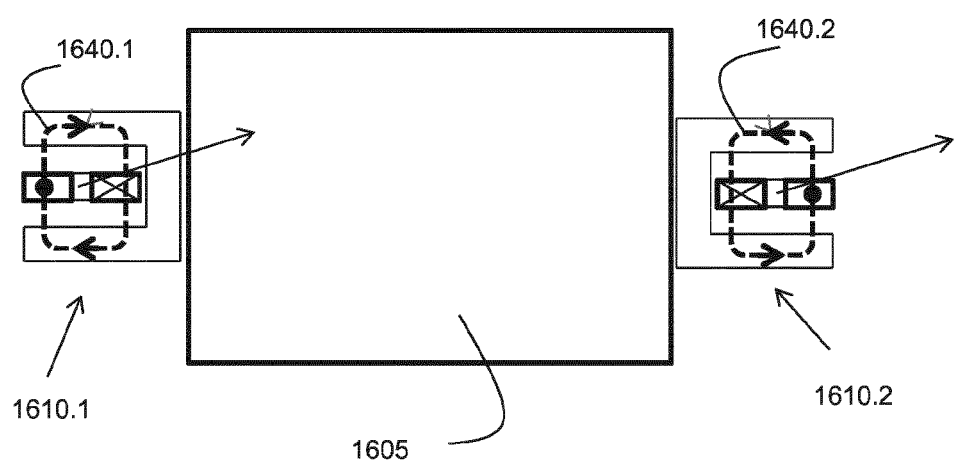

Note that the same effect as shown in FIG. 15 (c) can be obtained when the pair of actuators is mounted on opposing sides of the support. Such arrangement is schematically shown in FIG. 16. In FIG. 16, two actuators 1610.1 and 1610.2 are mounted on opposite sides of a support 1605, whereby the magnet assemblies of the actuators are constructed in such manner that the magnetic field distribution 1640.1 of the magnet assembly of the first actuator 1610.1 of the pair of actuators is a mirror image of the magnetic field distribution of the second actuator 1610.2 of the pair of actuators. As such, in the resulting force of both actuators, the parasitic force components that are proportional to the current $i^2$ may also cancel each other, in a similar manner as the arrangement of FIG. 15 (c).

In an embodiment of the present invention, the actuators according to the invention and as shown in FIGS. 4 to 8 may by applied in a support according to the invention, as e.g. shown in FIG. 9, 11 or 12, whereby the actuators are arranged in pairs, as discussed above, whereby a magnetic field distribution of the magnet assembly of a first actuator of the pair of actuators is a mirror image of a magnetic field distribution of a second actuator of the pair of actuators.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An electromagnetic actuator comprising:
a coil assembly comprising at least one coil;
a magnet assembly comprising a first and second magnet unit, each magnet unit comprising a magnetic yoke and a plurality of permanent magnets mounted to the magnetic yoke, the first and second magnet unit forming a magnetic circuit for receiving the coil assembly and, upon energizing of said coil, generating a force in a first direction; and
a holder for holding the magnet units, wherein the magnet units are rigidly mounted to the holder;
wherein a weight ratio of the magnet assembly over the coil assembly is smaller than a weight ratio of another magnet assembly over another coil assembly for which a ratio of force over electrical power is maximized, and
wherein the at least one coil comprises a first coil and a second coil, the coil assembly further comprising an inner cooling plate and two separate first and second outer plates, the inner cooling plate being arranged between the first and second coils to cool the first and second coils, the first and second coils and the inner cooling plate being stacked between the first and second outer cooling plates so that the first coil is arranged between the first outer cooling plate and the inner cooling plate and the second coil is arranged between the second outer cooling plate and the inner cooling plate.

2. The electromagnetic actuator according to claim 1, wherein the coil comprises a straight section and a curved section and wherein a projection of the magnet unit in a direction perpendicular to a plane co-planar with the coil only covers the straight section of the coil.

3. The electromagnetic actuator according to claim 1, wherein the holder comprises a C-shaped member.

4. The electromagnetic actuator according to claim 1, wherein the holder has an aperture, the magnet units being mounted to an inner surface of the aperture.

5. The electromagnetic actuator according to claim 1, wherein the magnetic yoke and/or the magnet units are slitted.

6. The electromagnetic actuator according to claim 1, wherein the magnetic yoke comprises CoFe.

7. The electromagnetic actuator according to claim 1, wherein the magnetic yoke of the magnet units comprises a plurality of magnetic yoke members that are independently mounted to the holder.

8. The electromagnetic actuator according to claim 1, wherein an outer surface of the magnet yoke is provided with a cooling member.

9. The electromagnetic actuator according to claim 1, wherein the holder is substantially made from Cordierite or a ceramic material having a mean thermal expansion coefficient of $0\pm0.007\times10^{-6}$ K$^{-1}$ in the temperature range of 0 to 50° C.

10. A support for supporting an object or object holder in a lithographic apparatus, the support comprises one or more actuators according to claim 1.

11. The support according to claim 10, wherein the holder of the one or more actuators is rigidly mounted to the support.

12. A lithographic apparatus comprising:
an illumination system configured to condition a radiation beam;
a first support constructed to support a patterning device, the patterning device being capable of imparting the radiation beam with a pattern in its cross-section to form a patterned radiation beam;
a second support constructed to hold a substrate; and
a projection system configured to project the patterned radiation beam onto a target portion of the substrate,
wherein the first or second support comprises a support according to claim 10.

13. A support for supporting an object or object holder in a lithographic apparatus, the support comprises a pair of actuators according to claim 1, wherein a magnetic field distribution of the magnet assembly of a first actuator of the pair of actuators is a mirror image of a magnetic field distribution of a second actuator of the pair of actuators.

14. The electromagnetic actuator according to claim 1, further comprising a plurality of spacers arranged to separate the inner cooling plate from the first outer cooling plate and from the second outer cooling plate.

15. The electromagnetic actuator according to claim 1, further comprising a common liquid supply system configured to supply the first and second outer cooling plates with liquid, the inner cooling plate being in fluid communication with the first and second outer cooling plates so that liquid supplied by the common liquid supply system flows first through the first and second outer cooling plates and then to the inner cooling plate.

16. A support for supporting an object or object holder in a lithographic apparatus, the support comprises a pair of actuators, each actuator comprising:
a coil assembly comprising at least one coil;
a magnet assembly comprising a first and second magnet unit, each magnet unit comprising a magnetic yoke and a plurality of permanent magnets mounted to the magnetic yoke, the first and second magnet unit forming a magnetic circuit for receiving the coil assembly and, upon energizing of said coil, generating a force in a first direction; and a holder for holding the first and second magnet units; wherein the actuators are provided on two opposite sides of the holder or are provided on a same side of the holder and parallel to each other, and wherein a magnetic field distribution of the magnet assembly of a first actuator of the pair of actuators is a mirror image of a magnetic field distribution of a second actuator of the pair of actuators.

17. The lithographic apparatus according to claim 16, wherein the actuators are provided on the same side of the holder.

* * * * *